United States Patent [19]
Pradal

[11] 4,096,451
[45] Jun. 20, 1978

[54] HIGH SIGNAL-TO-NOISE RATIO NEGATIVE RESISTANCE CRYSTAL OSCILLATOR

[75] Inventor: Bortolo Mario Pradal, Pittsburgh, Pa.

[73] Assignee: RCA Corporation, New York, N.Y.

[21] Appl. No.: 790,865

[22] Filed: Apr. 26, 1977

[30] Foreign Application Priority Data

Nov. 8, 1976 United Kingdom ............... 46463/76

[51] Int. Cl.² .................................................. H03B 5/36
[52] U.S. Cl. .................................. 331/116 R; 331/158
[58] Field of Search ................ 331/116 R, 117 R, 158

[56] References Cited

U.S. PATENT DOCUMENTS

| | | |
|---|---|---|
| 3,256,496 | 6/1966 | Angel ............................... 331/116 R |
| 3,528,032 | 9/1970 | Tahmisian, Jr. et al. ........ 331/116 R |
| 3,641,461 | 2/1972 | Mrozek ............................ 331/116 R |

*Primary Examiner*—Siegfried H. Grimm
*Attorney, Agent, or Firm*—E. M. Whitacre; P. J. Rasmussen; Robert L. Troike

[57] ABSTRACT

A high signal-to-noise crystal oscillator is provided, including a transistor and a crystal coupled across the input thereof. The oscillator further includes series connected capacitors coupled across the crystal and between the base electrode of the transistor and reference potential with the emitter coupled to the junction of said series connected capacitors. The value of the series connected capacitor is selected to be such that the ratio of the total capacitance between the emitter to ground to the total capacitance between the base and emitter electrodes is on the order of 5.4 to 1 to 3.9 to 1.

6 Claims, 9 Drawing Figures

HIGH SIGNAL-TO-NOISE RATIO NEGATIVE RESISTANCE CRYSTAL OSCILLATOR

BACKGROUND OF THE INVENTION

This invention relates to crystal oscillators and, more particularly, to crystal controlled transistor oscillators wherein the crystal is coupled between the base of the transistor and a point of reference potential and a voltage divider capacitor is coupled in parallel with said crystal between the base and reference potential with the junction point of the capacitor divider coupled to the emitter of the transistor. Oscillators of this type have been known for a number of years, for example, see Angel, U.S. Pat. No. 3,256,496 and Mrozek, U.S. Pat. No. 3,641,461.

In the prior art oscillators, the ratio of the above-described voltage dividing capacitance is such that the capacitance between the base and the emitter is equal to or usually larger than the capacitance between the emitter and the reference potential.

In the prior art, this capacitance between the base and the emitter is made large in parallel with the input transistor so as to control by swamping the base-to-emitter diffusion capacitance. This diffusion capacitance changes with temperature and should be minimized so that the oscillator frequency is not so dependent on temperature. Crystal frequency change or trimming in mobile applications is necessary to compensate for crystal aging and offset production tolerances. With present art oscillators, this trimming is accomplished by varying the negative reactance as seen by the crystal (load capacitance). Present art oscillators trim this frequency by varying the capacitance in series with the crystal or by varying the emitter to ground capacitor while maintaining a large capacitance shunting the transistor input. The merit of having the capacitance in series with the crystal is that there is a large PPM/PF (parts per million per picofarad) frequency deviations but this arrangement is most sensitive to frequency trimming effects. See above cited Mrozek U.S. Pat. No. 3,641,461. Since the capacitance in series with the crystal is most sensitive to frequency trimming effects the alternative of the varying part of the emitter to ground capacity is used. This technique however creates additional noise sources by introducing the compensation thermistor resistor in series with the crystal which degrade the circuit Q or dictates a certain relatively high value of emitter resistance to minimize the frequency trimming effects. Another reason why the minimization of the noise sources is difficult is because large values of emitter resistance are necessary to limit the frequency range dependency of the magnitude of the relative excursion of the reactive part of the input impedance of the oscillator. This characteristic is very important in mobile oscillator applications wherein the same basic circuit has to cover a frequency octave in most cases (usually 10 – 20 MHz at the fundamental of the crystal). The lack of uniformity of this reactance vs. frequency would require a range of component value with frequency of oscillation making production less practical and/or more expensive. A large capacitance between base and emitter of the oscillator transistor for a given load capacitance has the effect to reduce the amount of voltage available across the crystal and therefore a relatively lower signal is obtained at the output. Since the above noise sources have a limit of minimization, any reduction of the power output also limits the maximum signal-to-noise ratio obtainable directly from the crystal oscillator.

Although in the prior art, there is an oscillator of the type with the ratio of the voltage dividing capacitors across the crystal being such that the capacitor added across the base-to-emitter junction is less than that across the emitter ground, (see, for example, U.S. Pat. No. 3,528,032 of Tahmisian, Jr. et al.) this value of capacitance appears to have been selected to emphasize the harmonic content. Moreover, the particular transistor device involved has a relatively large base-to-emitter diffusion capacitance and hence the total value of the impedance across the base-to-emitter electrodes becomes relatively small with respect to the value of impedance between emitter and the reference potential. This effectively reduces the portion of the signal existing across the crystal that is transferred at the transistor input results in lower signal level at the output of the oscillator device and consequently produces a relatively low signal-to-noise ratio.

SUMMARY OF THE INVENTION

Briefly, the above indicated signal-to-noise ratio improvement with better temperature stability and higher output power is achieved by an oscillator including a current conducting device having input, output and control electrodes with DC biasing potentials applied to these electrodes. The biasing means includes an impedance element coupled between the input electrode and a point of reference potential. The frequency determining circuit includes a resonant element coupled between the control electrode and reference potential and a pair of capacitors connected in series with the series connected between the control electrode and reference potential. The junction point of said series connected capacitors is directly coupled to the input electrode to provide feedback to sustain oscillation. The values of the series connected capacitors being determined together with the value of the input impedance to bias said current conductive device into the negative resistance region where the current conducting device is forward biased for only 70° to 90° of the RF cycle.

DESCRIPTION OF THE INVENTION

Figure 1:
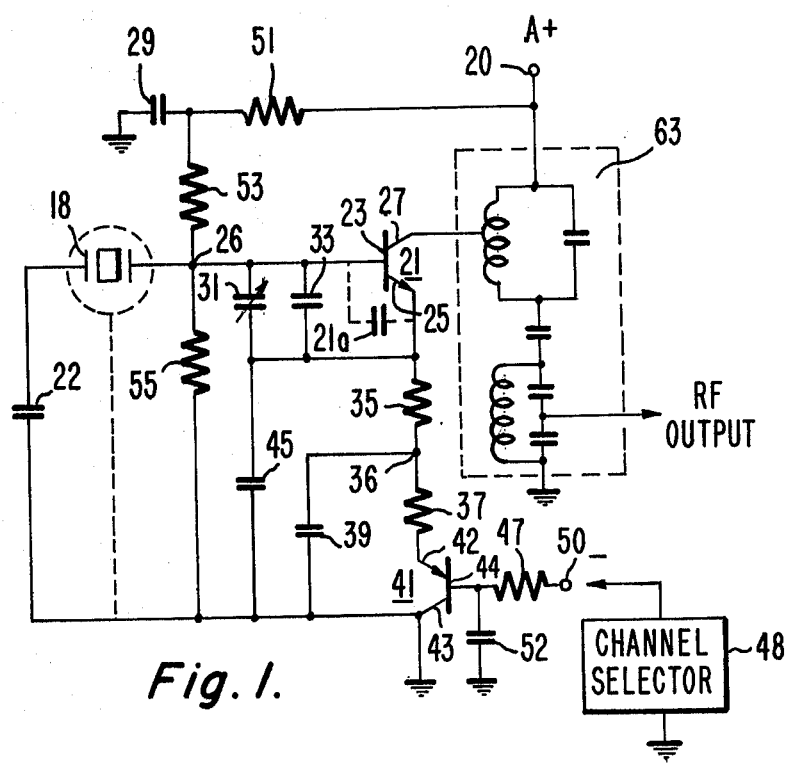
FIG. 1 is a schematic drawing of the oscillator in accordance with a preferred embodiment of the present invention.

Referring to FIG. 1, there is shown a crystal oscillator comprising a resonant circuit and an amplifier. The amplifier includes an NPN transistor 21 having a base electrode 23, emitter electrode 25 and collector electrode 27. The biasing potentials for the transistor amplifier are provided via A+ at terminal 20. The base 23 of transistor 21 is coupled to the junction 26 of resistors 53 and 55. Resistors 51 and 53 are coupled between the bias source 20 and the base 23 of transistor 21. The collector 27 is coupled to a three pole band pass filter load 63 and to the source terminal 20. The three pole band pass filter load is designed to pass signals at the collector output at the third harmonic of the fundamental frequency of the oscillator. RF bypass of the power supply is provided by capacitor 29 at the junction of resistors 51 and 53. The emitter 25 of transistor 21 is coupled via resistors 35 and 37 to the emitter 42 of PNP transistor 41. The collector 43 of transistor 41 is coupled to ground or reference potential and the base 44 is coupled via resistor 47 to a channel selection means 48 whereby when the oscillator is to be activated a zero or negative signal of less than two volts (−2 volts) is coupled through resistor 47 to the base 44 of transistor 41. The junction 36 of resistors 35 and 37 is coupled via capacitor 39 to ground or reference potential. Capacitor 52 is an RF bypass of the channel selection line. A voltage feedback capacitor network is provided by the combination of the parallel capacitances 31 and 33 in series with capacitor 45 between the base 23 and ground or reference potential. Capacitor 31 is variable and capacitor 33 is fixed and these parallel capacitors are coupled between the base 23 and emitter 25 of transistor 21. The capacitor 45 is coupled between the emitter and ground or reference potential. The transistor 41 operates only as a switching transistor such that when a zero or negative level signal is applied to base 44 of transistor 41, the transistor is forward biased with the emitter 25 of transistor 21 coupled via resistors 35, 37 and 47 to ground via switching terminal 50. A crystal resonant circuit comprised of crystal 18 in series with capacitor 22 is coupled between the base 23 and ground potential.

The components of the oscillator described in FIG. 1 have the following values.

Transistor 21 is a type NPN transistor 2N2857 with cutoff frequency of more than 1 GHz and an input diffusion capacitance of about 20 picofarads. Transistor 21 has a β range of 50 to 200.

The other parameters are as follows:

Capacitor 45 — 270 ± 5% pF (picofarads)
Capacitor 31 — 7 - 25 pF
Capacitor 33 — 24 ± 2% pF
Capacitor 39 — 1 ± 20% μF (microfarads)
Capacitor 29 — 0.01 ± 10% μF
Capacitor 22 — 44 ± 2% pF
Capacitor 52 — 0.01 ± 10% μF
Resistor 51 — 1k ohm
Resistor 53 — 7.5k ohms
Resistor 55 — 8.25k ohms
Resistor 35 — 562 ohms
Resistor 37 — 562 ohms
Resistor 47 — 1k ± 5% ohms Bias at terminal 20 is 9.5 volts. The crystal 18 is an AT cut quartz crystal.

Figure 2:
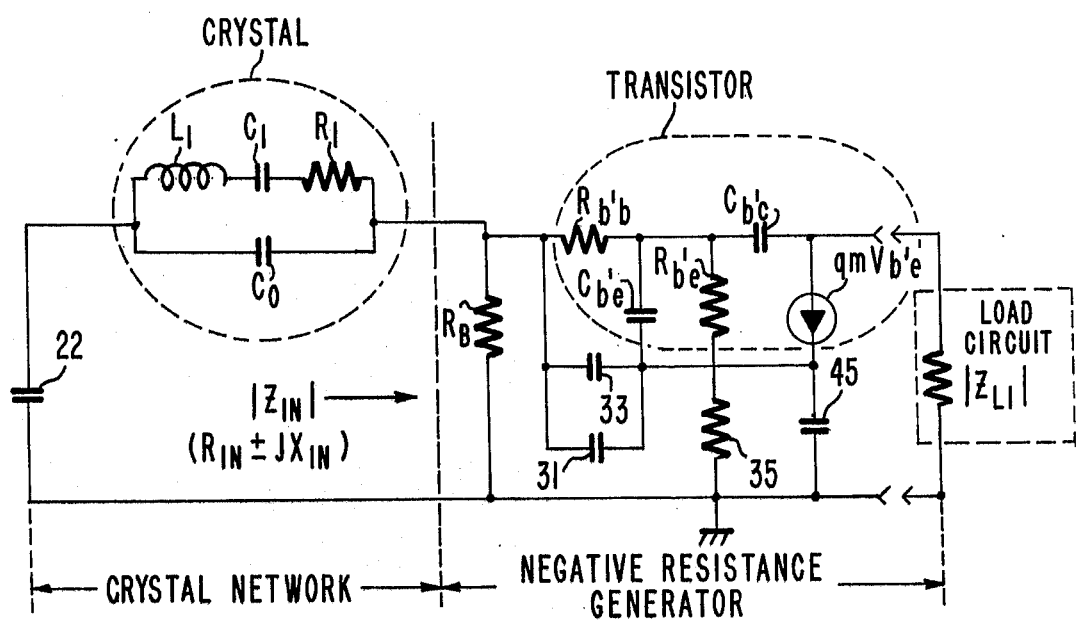
FIG. 2 illustrates the equivalent AC circuit of the oscillator of FIG. 1 before the oscillation steady state is reached.
Figure 3:
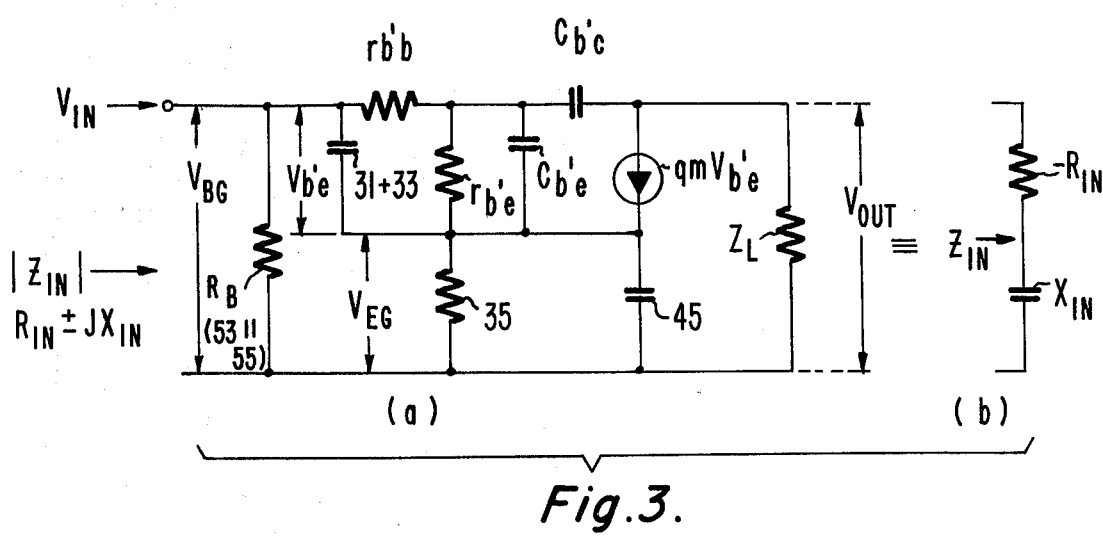
FIG. 3 is the equivalent hybrid circuit of the amplifier of FIG. 1.

FIG. 2 illustrates the equivalent AC circuit of the oscillator of FIG. 1. In FIG. 2 the crystal is substituted by its equivalent circuit in the fundamental mode of vibration and is composed of the motional electrical parameters $L_1$, $C_1$, $R_1$ in parallel with the shunt capacitance $C_0$. The other part of the circuit is a current negative feedback amplifier with an output load dimension in such a way that the voltage gain of the amplifier will be always less than unity. The equivalent hybrid circuit of this amplifier is shown separated from the crystal network in FIG. 3a.

Analysis of this circuit shows that it can be designed, by proper choice of the transistor parameters $g_m$, $R_{b'e}$, $C_{b'e}$ and the proper choice of the external capacitor 22, capacitors 31 and 33, capacitor 45, $R_B$, and resistor 35, to present a negative resistance $-R_{IN}$ in series with a capacitive reactance $X_{IN}$ at its input. See FIG. 3b. This negative input resistance will be utilized to start and maintain electrical oscillations and supply electrical power at the frequency of oscillation at the output of the amplifier.

Figure 4:
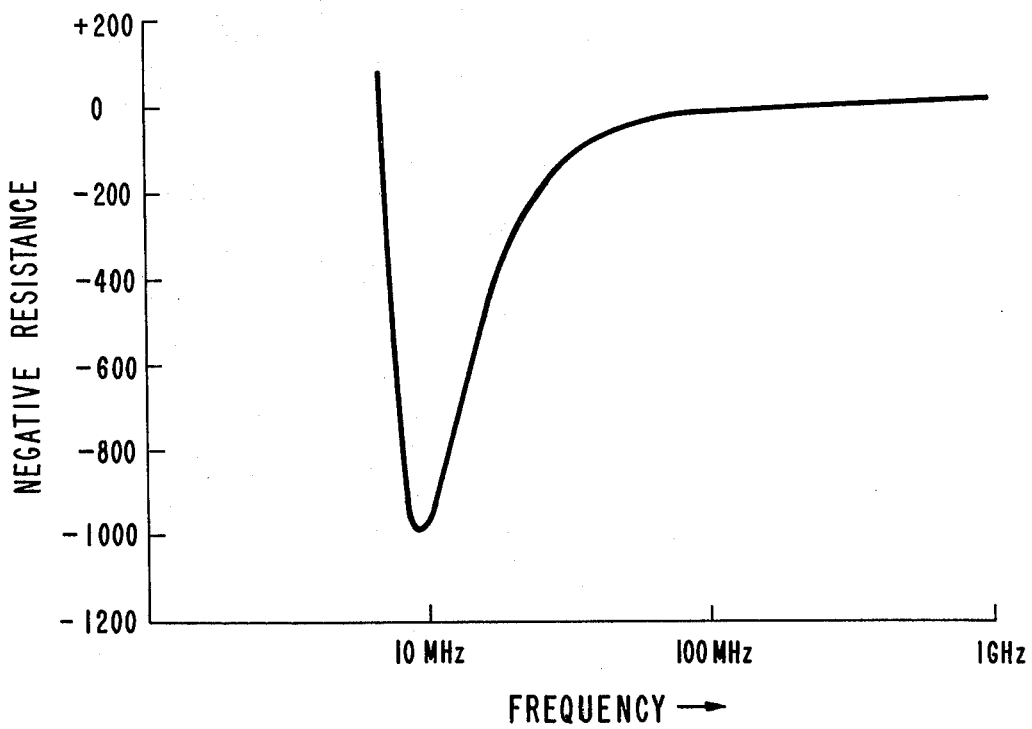
FIG. 4 is a plot of negative resistance vs. frequency for the amplifier of FIG. 1.
Figure 5:
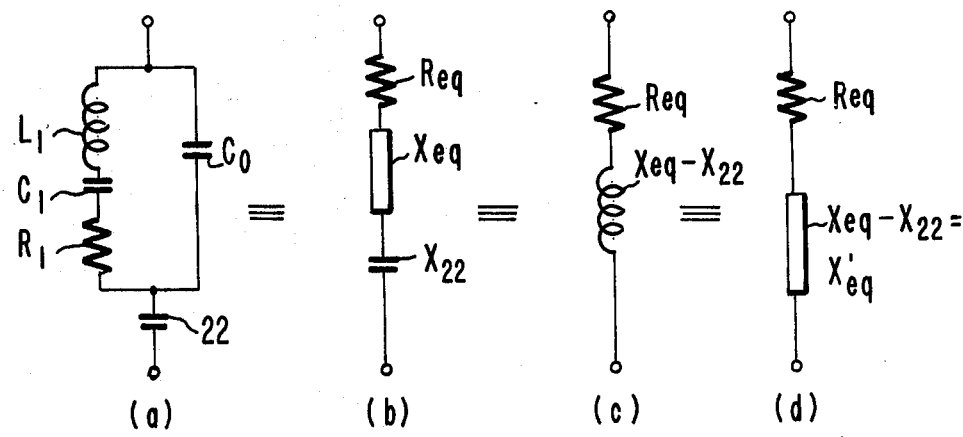
FIG. 5 illustrates the equivalent circuit of the crystal network of FIG. 1.
Figure 6:
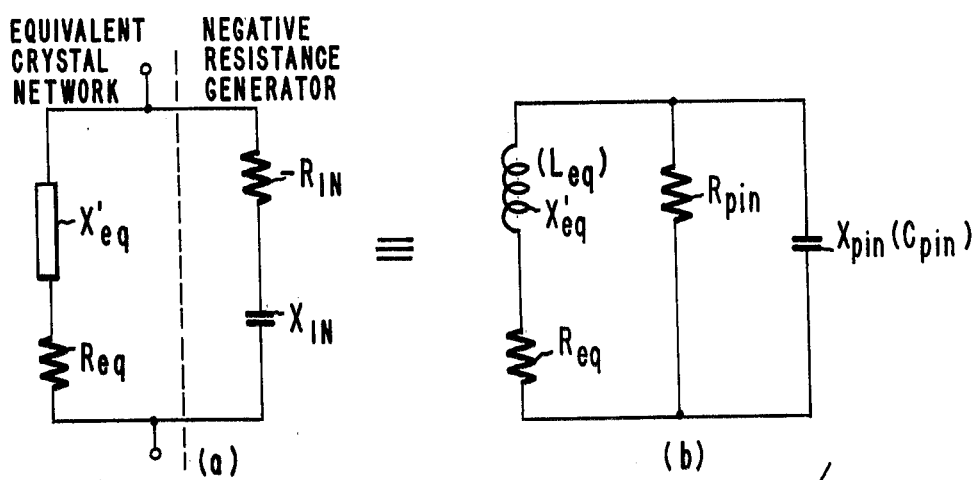
FIG. 6 illustrates the combined equivalent crystal network and the equivalent negative resistance generator of FIG. 1.

A plot of the real part of the input impedance of the oscillator of FIG. 1 is shown in FIG. 4 with the third harmonic band pass filter as the load. Note that maximum negative resistance with the component values given, occurs at about 10 MHz. The equivalent circuit of a crystal oscillating at its fundamental is shown in FIG. 5. By simple frequency transformation as illustrated in FIG. 5, the circuit of FIG. 5a can be reduced to the circuit of FIG. 5d. It can be shown that the equivalent circuit of FIG. 5d is composed of a resistance $R_{eq}$ which represents the lumped crystal losses, and a reactance that is always inductive between the two characteristic frequencies of the crystal. These two characteristic frequencies of the crystal are called the crystal zero frequency (or series resonant frequency) and pole frequency (or parallel resonant frequency). Below and above the zero and pole frequencies, the crystal reactance is always capacitive. If we join the circuit at FIG. 5d with the circuit at FIG. 3b, we obtain the circuit illustrated in FIG. 6a and its parallel equivalent shown in FIG. 6b. If $X_{IN}$ is capacitive, the usual case for the circuit of FIG. 3, it can be shown that this circuit becomes oscillatory with increasing amplitude when the sum of the real part of the impedances in the loop is greater than zero; i.e., $-R_{IN}$ is greater than $R_{eq}$, at a frequency where the sum of the reactances in the loop is zero. The condition for oscillation is shown to be:

$$C_{PIN} \cdot R_{PIN} \leq \frac{L_{eq}}{R_{eq}}$$

When steady oscillation is reached, the frequency is essentially given by:

$$F_{osc} = \tfrac{1}{2} \pi \sqrt{L_{eq} \cdot C_{PIN}}$$

The resistance $-R_{IN}$ is the slope of the current versus voltage characteristic of the amplifier input and therefore it is a dynamic quantity, itself a function of the amplitude of the oscillations. Once the oscillation is started, the increasing amplitude of the oscillation decreases the value of the negative resistance $-R_{IN}$ until an equilibrium steady state point is reached. At the steady state operation, the negative resistance exceeds the total equivalent passive resistance of the circuit just enough to supply the amount of energy required to maintain the oscillation and the power dissipated at the output in the load and in the lossy elements of the amplifier. An excess of the negative resistance available with respect to the minimum required to maintain the oscillation is a measure of the power that can be made available at the oscillator output.

Figure 7:
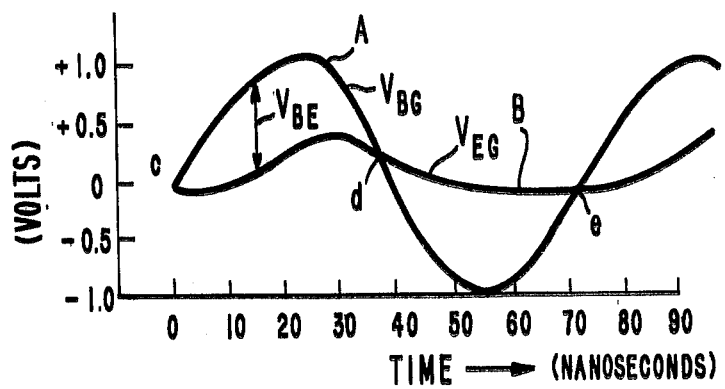
FIG. 7 is a plot of measured voltage (0.5 volt per division) vs. time (10 nanoseconds per division) for the oscillator of FIG. 1.

Typical mobile radio applications require the minimization of the internal oscillator noise sources and maximization of its output signal amplitude. These two requirements are normally conflicting since increasing the power output normally increases the amount of noise generated. Improved signal-to-noise ratio is achieved herein by the use of a particular ratio of the capacitances 31, 33 and 21a to capacitor 45 for a given value of emitter resistance 35 and oscillator frequency range. The combined capacitance $C_P$ provided by the parallel capacity of variable capacitor 31, capacitor 33 and the base to emitter capacity 21a of transistor 21 is made relatively small compared to the capacity provided by capacitance 45. The base to emitter capacity 21a of transistor 21 relates to the diffusion capacitance of the transistor which varies as a function of bias voltage and temperature. Since the combined capacity $C_P$ of capacitors 31, 33 and 21a is rather small compared to the capacity of capacitor 45 in series therewith, a larger portion of the voltage is developed between the base and the emitter of transistor 21 when the crystal 18 in series with the capacitor 22 is added because of the relatively high impedance provided via the parallel capacity of capacitors 31 and 33. This results in the waveform illustrated in FIG. 7. In FIG. 7, there is illustrated the voltage between the base and ground in curve A. Curve B illustrates the voltage between the emitter and ground. As can be seen, the RF base to emitter voltage ($V_{BE}$) is positive with respect to $V_{EG}$, the emitter to ground voltage, during a portion $c$ to $d$ of the cycle of curve A and is minus during another portion $d$ to $e$ of the cycle. The transistor 21 is therefore reverse biased during a portion of the cycle.

Figure 8:
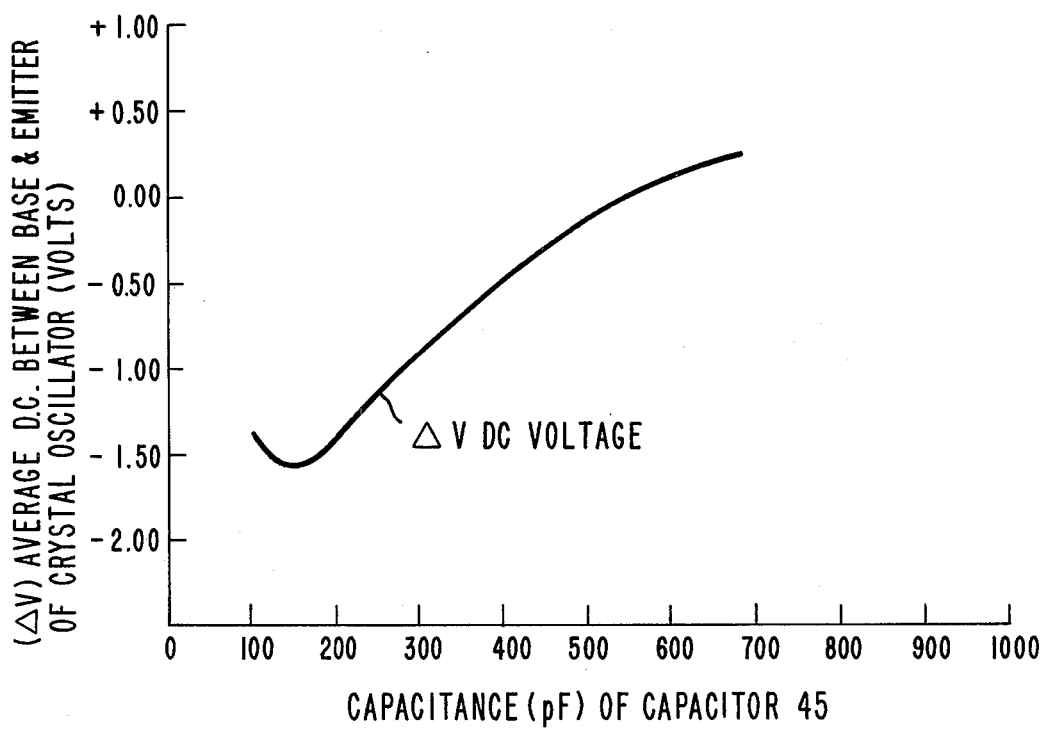
FIG. 8 is a plot of average DC voltage between the base and emitter of the transistor of FIG. 1 vs. the value of capacitance of capacitor 45 for a total external capacitance between base and emitter equal to 51 picofarads.
Figure 9:
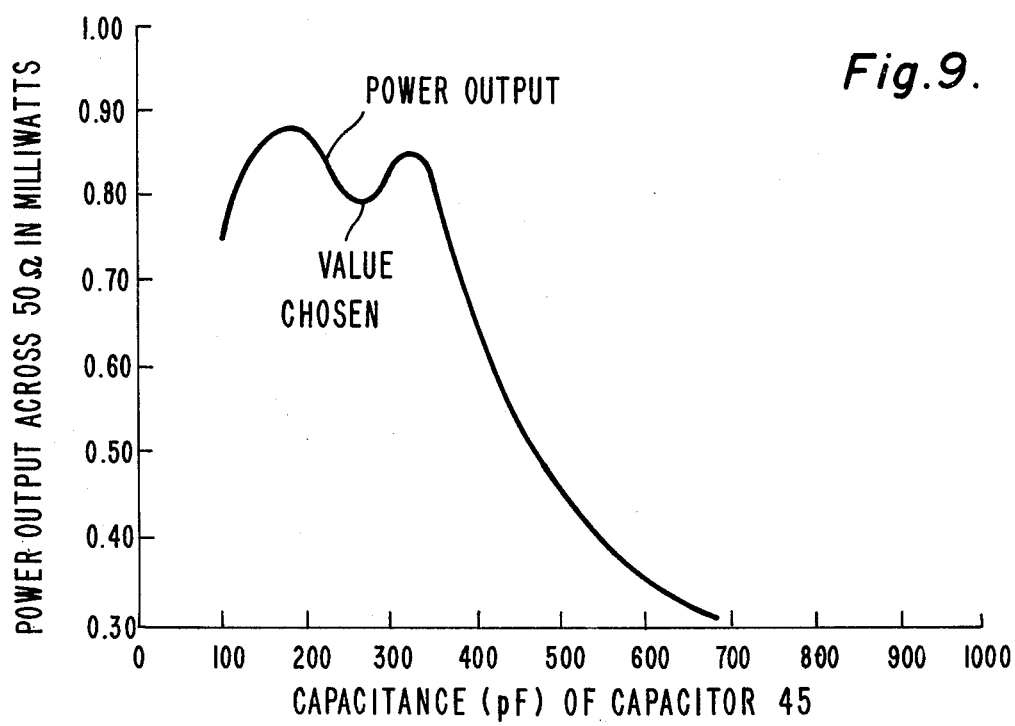
FIG. 9 is a plot of power output from the oscillator of FIG. 1 vs. the value of capacitance of capacitor 45 for a total external capacitance between base and emitter equal to 51 picofarads.

By the above ratio of capacitance values most of the signal to be applied to the amplifier is across the transistor input (base-to-emitter) to thus provide more signal gain and thereby increase the signal-to-noise ratio. The voltage $V_{BE}$ in FIG. 7 illustrates this applied voltage. There is a limit to the ratio of this capacitance of capacitor 45 to capacitance $C_P$ of about six because the forward bias $V_{BE}$ across the transistor input disappears and the average DC voltage between the base and emitter is no longer negative to provide a negative resistance. Also, the feedback voltage becomes too small to sustain oscillations. For a value of total external capacity across the base emitter of 51 picofarads, FIG. 8 presents a plot of the average DC voltage between the base and emitter. Note that for capacitance values of capacitor 45 of from 100 to 500 the average DC voltage between the base and emitter is negative indicating a reverse bias condition. This reverse bias condition is also illustrated in FIG. 7. FIG. 9 illustrates that maximum power output across a 50 ohm third harmonic load occurs with the value of capacitor 45 between approximately 125 and 360 picofarads or the ratio of capacitor 45 to the combined external capacitance ratio between 2.45 to 1 to 7.05 to 1. The power output is fairly level over this range. A value for capacitor 45 is chosen within this range and is preferably in the middle. The value of capacitor 45 must be of a minimum value for the frequency of operation so as to resonate with emitter resistance 35 to minimize by frequency shaping the emitter resistor noise source bandwidth. The optimum chosen value is of the order of 3.9 to 1 to 4.7 to 1 to permit frequency adjustment of the oscillator.

Further in addition to providing more power output, the above-described ratio of capacity selected reduces the temperature sensitive diffusion capacity. The transistor 21 selected is one to have a low input diffusion capacitance. The capacitance of the particular transistor used was about 20 picofarads. Therefore the total capacity ($C_P$) is about 71 picofarads. By arranging the ratio of the emitter to ground capacitance relative to the total base to emitter capacitance as described above, the transistor is forward biased only during a portion of the signal. This causes the diffusion capacity to be reduced since diffusion capacity is increased when the transistor is forward biased. This arrangement therefore provides a more temperature stable oscillator. In addition to the reduction of this $C_{b'e}$ capacitance temperature sensitivity, this characteristic of the oscillator reduces through a relative reduction of the base current the magnitude of the noise current source.

Still further since the output is of pulsed type (reverse biased for a part of the cycle) this type output enhances the chosen harmonics of the crystal frequency to be provided at the filter 63. The component value used in the circuit of FIG. 1 is arranged to optimize the harmonics of the crystal frequency. Other harmonic orders can be optimized by changing the ratio of the capacitances of capacitor 45 to capacitors 31 and 33 and $C_{b'e}$, $g_m$ and other transistor parameters.

For a circuit as shown in FIG. 1, the ratio of the capacitors would be selected such that average DC between the base-to-emitter would be negative and the conduction angle of the transistor would be between 70° and 90°. The capacitance ratio including the internal capacity may be described as on the order of 270/51 to 270/69.

The above-described invention minimizes all sources of device noise and maximizes the signal power output. Minimization of the noise source is obtained by the proper choice of the component values and types. The maximization of the signal is obtained by the proper choice of the ratio of the feedback capacitors that both maximizes the signal available at the amplifying device input and shapes and minimizes the emitter noise source with a relatively large capacitor. This is of particular importance where the oscillator frequency is to be multiplied several times, as in mobile radio applications, since noise level and bandwidth are exponentially increased by the multiplication process. To properly shape the various device noise sources, for a given noise level at a given frequency from the carrier, the capacitor across the emitter resistor has to be of at least a minimum value within the limits or range of values that satisfy the minimum feedback value required to sustain the crystal oscillation.

A network for temperature compensation of the crystal oscillator described herein is disclosed in application Ser. No. 741,405 filed Nov. 12, 1976 and entitled "NETWORK FOR TEMPERATURE COMPENSATION OF AN AT CUT QUARTZ CRYSTAL OSCILLATOR." This compensation network is invented by the same inventor herein, Bortolo Mario Pradal.

What is claimed is:

1. A high signal-to-noise ratio negative resistance oscillator comprising:
    a current conducting device having input, output and control electrodes,
    means coupled to said electrodes for applying D.C. biasing potentials to electrodes of said current conducting device, said D.C. biasing means including an impedance coupled between the input electrode and a point of reference potential,
    a frequency determining circuit including a resonant element coupled between said control electrode and said point of reference potential, said frequency determining circuit further including capacitors connected in series between said control electrode and said point of reference potential,
    means for connecting the input electrode of said current conducting device to the junction point of said series connected capacitors for providing feedback to sustain oscillations,
    the ratio of the total capacitance between the input electrode and reference potential to the total capacitance between the control and input electrodes is from 5.4 to 1 to 3.9 to 1.

2. The combination of claim 1 wherein said resonant element is a crystal.

3. A high signal-to-noise ratio negative resistance oscillator comprising:
    a transistor having a base, collector and emitter electrode,
    means coupled to said electrodes for applying D.C. biasing potentials to the electrodes of said transistor, said biasing means including an emitter resistor coupled between the emitter electrode and a point of reference potential,
    a frequency determining circuit including a crystal coupled between said base electrode and said point of reference potential, said frequency determining circuit further including capacitors connected in series between said base electrode and said point of reference potential,
    means for connecting the emitter electrode of said transistor to the junction point of said series connected capacitors for providing feedback to sustain oscillations,
    the ratio of the capacitance between the emitter and reference potential to the total external capacitance between the base and emitter is from 2.45 to 1 to 7.05 to 1.

4. The combination claimed in claim 3, wherein the capacitance between the base and emitter electrodes includes a variable and fixed capacitor connected in parallel, wherein the variable capacitor is a warping capacitor to adjust for production calibration tolerance and the long term crystal aging.

5. The combination in claim 3, wherein the value of the total base to emitter capacity is on the order of 51 to 69 picofarads.

6. The combination of claim 5, wherein the emitter to reference potential capacity is on the order of 270 picofarads.

* * * * *